United States Patent
Gong et al.

(10) Patent No.: US 9,142,502 B2
(45) Date of Patent: Sep. 22, 2015

(54) SEMICONDUCTOR DEVICE PACKAGING HAVING PRE-ENCAPSULATION THROUGH VIA FORMATION USING DROP-IN SIGNAL CONDUITS

(76) Inventors: Zhiwei Gong, Chandler, AZ (US); Navjot Chhabra, Austin, TX (US); Glenn G. Daves, Austin, TX (US); Scott M. Hayes, Chandler, AZ (US); Douglas G. Mitchell, Tempe, AZ (US); Jason R. Wright, Chandler, AZ (US)

(*) Notice: Subject to any disclaimer, the term of this patent is extended or adjusted under 35 U.S.C. 154(b) by 0 days.

(21) Appl. No.: 13/222,143

(22) Filed: Aug. 31, 2011

(65) Prior Publication Data

US 2013/0049217 A1     Feb. 28, 2013

(51) Int. Cl.
| | |
|---|---|
| H01L 21/768 | (2006.01) |
| H01L 23/498 | (2006.01) |
| H01L 23/538 | (2006.01) |
| H01L 23/00 | (2006.01) |
| H01L 21/56 | (2006.01) |

(52) U.S. Cl.
CPC .... *H01L 23/49827* (2013.01); *H01L 23/49822* (2013.01); *H01L 23/5389* (2013.01); *H01L 24/18* (2013.01); *H01L 24/19* (2013.01); *H01L 21/568* (2013.01); *H01L 2224/0401* (2013.01); *H01L 2224/04105* (2013.01); *H01L 2224/12105* (2013.01); *H01L 2924/15311* (2013.01)

(58) Field of Classification Search
USPC .......... 257/686, 678; 438/123, 108, 109, 112, 438/118, 124
See application file for complete search history.

(56) References Cited

U.S. PATENT DOCUMENTS

| | | |
|---|---|---|
| 3,865,458 A | 2/1975 | Pauza et al. |
| 5,710,063 A | 1/1998 | Forehand et al. |
| 5,886,401 A | 3/1999 | Liu |
| 6,081,989 A | 7/2000 | Pluymers et al. |
| 6,271,057 B1 | 8/2001 | Lee et al. |
| 6,372,619 B1 | 4/2002 | Huang et al. |
| 6,743,660 B2 * | 6/2004 | Lee et al. ...................... 438/108 |
| 6,872,591 B1 | 3/2005 | Wang et al. |
| 6,876,066 B2 * | 4/2005 | Fee et al. ...................... 257/666 |
| 7,030,469 B2 | 4/2006 | Mahadevan et al. |
| 7,071,554 B2 | 7/2006 | Hussein et al. |
| 7,078,788 B2 | 7/2006 | Vu et al. |
| 7,189,595 B2 * | 3/2007 | Magerlein et al. ............ 438/108 |

(Continued)

OTHER PUBLICATIONS

U.S. Appl. No. 13/222,150, Inventor Zhiwei Gong, "Semiconductor Device Packaging Having Pre-Encapsulation Through VIA Formation", filed Aug. 31, 2011, Office Action—Restriction, mailed Sep. 20, 2012.

(Continued)

*Primary Examiner* — Jaehwan Oh

(57) ABSTRACT

A semiconductor device package having pre-formed and placed through vias and a process for making such a package is provided. One or more signal conduits are placed in a holder that is subsequently embedded in an encapsulated semiconductor device package. The ends of the signal conduits are exposed and the signal conduits are then used as through package vias, providing signal-bearing pathways between interconnects or contacts on the bottom and top of the package. Holders can be provided in a variety of geometries and materials, depending upon the nature of the application. Further, multiple holders with signal conduits can be provided in a single package to provide for more complex interconnect configuration demands in, for example, system-in-a-package applications.

13 Claims, 6 Drawing Sheets

(56) References Cited

U.S. PATENT DOCUMENTS

| | | | |
|---|---|---|---|
| 7,495,319 B2 | 2/2009 | Fukuda et al. | |
| 7,556,983 B2 | 7/2009 | Kurita | |
| 7,633,765 B1 | 12/2009 | Scanlan et al. | |
| 7,671,457 B1 | 3/2010 | Hiner et al. | |
| 7,671,459 B2* | 3/2010 | Corisis et al. | 257/686 |
| 7,678,612 B2* | 3/2010 | Fujii et al. | 438/118 |
| 7,704,800 B2 | 4/2010 | Zhang | |
| 7,799,603 B2 | 9/2010 | Tsai et al. | |
| 7,812,457 B2* | 10/2010 | Kurita | 257/777 |
| 7,838,420 B2 | 11/2010 | Tang et al. | |
| 7,842,542 B2 | 11/2010 | Shim et al. | |
| 7,863,098 B2* | 1/2011 | Lange et al. | 438/108 |
| 7,863,729 B2* | 1/2011 | Hsu et al. | 257/700 |
| 7,875,505 B2 | 1/2011 | Wang | |
| 7,892,962 B2* | 2/2011 | Su | 438/612 |
| 7,989,950 B2* | 8/2011 | Park et al. | 257/724 |
| 8,017,452 B2 | 9/2011 | Ishihara et al. | |
| 8,021,930 B2 | 9/2011 | Pagaila | |
| 8,039,304 B2 | 10/2011 | Pagaila | |
| 8,049,323 B2* | 11/2011 | Chen et al. | 257/690 |
| 8,110,911 B2 | 2/2012 | Ishihara et al. | |
| 8,120,149 B2 | 2/2012 | Camacho et al. | |
| 8,227,338 B1 | 7/2012 | Scanlan et al. | |
| 8,227,927 B2* | 7/2012 | Chen et al. | 257/797 |
| 8,242,601 B2* | 8/2012 | Chou et al. | 257/758 |
| 8,273,660 B2* | 9/2012 | Park et al. | 438/690 |
| 8,338,922 B1* | 12/2012 | Sirinorakul et al. | 257/666 |
| 8,383,950 B1 | 2/2013 | Huemoeller et al. | 174/255 |
| 2002/0180013 A1* | 12/2002 | Brofman et al. | 257/678 |
| 2003/0090883 A1* | 5/2003 | Asahi et al. | 361/761 |
| 2004/0195691 A1 | 10/2004 | Moriyasu et al. | |
| 2005/0012186 A1 | 1/2005 | Zimmerman | |
| 2005/0029642 A1* | 2/2005 | Takaya et al. | 257/678 |
| 2005/0247665 A1* | 11/2005 | Oi et al. | 216/13 |
| 2005/0287714 A1* | 12/2005 | Walk et al. | 438/127 |
| 2006/0012178 A1 | 1/2006 | Finley et al. | |
| 2006/0087044 A1 | 4/2006 | Goller | |
| 2006/0291029 A1 | 12/2006 | Lin et al. | |
| 2007/0212865 A1 | 9/2007 | Amrine et al. | |
| 2008/0224283 A1* | 9/2008 | Pu et al. | 257/673 |
| 2009/0050994 A1 | 2/2009 | Ishihara et al. | |
| 2009/0057849 A1 | 3/2009 | Tang et al. | |
| 2009/0130801 A1* | 5/2009 | Fukuda et al. | 438/123 |
| 2010/0006994 A1* | 1/2010 | Shim et al. | 257/676 |
| 2010/0013081 A1* | 1/2010 | Toh et al. | 257/692 |
| 2010/0127386 A1 | 5/2010 | Meyer-Berg | |
| 2010/0200970 A1* | 8/2010 | Zhang | 257/673 |
| 2011/0037154 A1* | 2/2011 | Shim et al. | 257/676 |
| 2011/0065241 A1 | 3/2011 | Lin et al. | |
| 2011/0163435 A1* | 7/2011 | Tsukamoto et al. | 257/676 |
| 2012/0168884 A1 | 7/2012 | Yao et al. | |
| 2012/0181874 A1 | 7/2012 | Willkofer et al. | |

OTHER PUBLICATIONS

U.S. Appl. No. 13/222,148, Inventor Zhiwei Gong, Semiconductor Device Packaging Having Pre-Encapsultion Through VIA Formation Using Lead Frames Attached Signal Conduits, filed Aug. 31, 2011, Office Action—Resriction, mailed Nov. 9, 2012.

U.S. Appl. No. 13/222,150, Inventor Zhiwei Gong, "Semiconductor Device Packaging Having Pre-Encapsulation Through VIA Formation", filed Aug. 31, 2011, Office Action—Rejection, mailed Dec. 6, 2012.

U.S. Appl. No. 13/299,564, Inventor Zhiwei Gong, "Semiconductor Device Packaging Having Pre-Encapsulation Through VIA Formation", filed Nov. 18, 2011, Office Action—Rejection, mailed Dec. 19, 2012.

Office Action mailed Jan. 7, 2013 in U.S. Appl. No. 13/222,148.

Office Action mailed Apr. 26, 2013 in U.S Appl. No. 13/222,150.

Office Action mailed May 31, 2013 in U.S. Appl. No. 13/299,564.

Notice of Allowance mailed Jul. 10, 2013 in U.S. Appl. No. 13/222,150.

Office Action mailed Jul. 31, 2013 in U.S. Appl. No. 13/299,564.

Office Action mailed Aug. 19, 2013 in U.S. Appl. No. 13/222,148.

Office Action mailed Sep. 13, 2013 in U.S. Appl. No. 13/222,150.

U.S. Appl. No. 13/222,148, Gong, Zhiwei, "Semiconductor Device Packaging Having Pre-Encapsultion Through Via Formation Using Lead Frames With Attached Signal Conduits", filed Aug. 31, 2011, Office Action—Notice of Allowance, mailed Oct. 29, 2014.

U.S. Appl. No. 13/222,150, Inventor Zhiwei Gong, "Semiconductor Device Packaging Having Pre-Encapsulation Through VIA Formation", filed Aug. 31, 2011, Office Action—Final Rejection, mailed Sep. 29, 2014.

Office Action mailed Mar. 20, 2014 in U.S. Appl. No. 13/222,143.

U.S. Appl. No. 13/222,148, Gong, Zhiwei, "Semiconductor Device Packaging Having Pre-Encapsultion Through Via Formation Using Lead Frames With Attached Signal Conduits", filed Aug. 31, 2011, Office Action—Notice of Allowance, mailed Apr. 4, 2014.

* cited by examiner

SEMICONDUCTOR DEVICE PACKAGING HAVING PRE-ENCAPSULATION THROUGH VIA FORMATION USING DROP-IN SIGNAL CONDUITS

CROSS-REFERENCE TO RELATED APPLICATION(S)

This application is related to U.S. patent application Ser. No. 13/222,148 filed on even date, entitled "SEMICONDUCTOR DEVICE PACKAGING HAVING PRE-ENCAPSULATION THROUGH VIA FORMATON USING LEAD FRAMES WITH ATTACHED SIGNAL CONDUITS," naming Zhiwei Gong, Navjot Chhabra, Glenn G. Daves, and Scott M. Hayes as inventors, and assigned to the current assignee hereof, and U.S. patent application Ser. No. 13/222,150, filed on even date, entitled "SEMICONDUCTOR DEVICE PACKAGING HAVING PRE-ENCAPSULATION THROUGH VIA FORMATION," naming Zhiwei Gong, Navjot Chhabra, Glenn G. Daves, and Scott M. Hayes as inventors, and assigned to the current assignee hereof.

BACKGROUND

1. Field

This disclosure relates generally to semiconductor device packaging, and more specifically, to providing through-package vias in an encapsulated device package by using pre-formed signal conduits, such as conductive pillars and optical waveguides.

2. Related Art

Semiconductor and other types of electronic devices are often encapsulated wholly or partly in resin to provide environmental protection and facilitate external connection to the devices. Subsequent to encapsulation, interconnect structures can be built up on one or both sides of the encapsulated devices. For packages having electrical contacts on both top and bottom surfaces (e.g., a double-sided buildup), through-vias are often made to provide contacts between bottom side and top side interconnect structures. Traditionally, through package vias are made after encapsulation using a drilling and filling/metallization process that includes steps for via drill, via fill/metallization, polish and taping, and so on. This process of post-encapsulation via formation introduces complexities to the manufacturing process that have a variety of manufacturing and reliability challenges (e.g., consistent integrity of the through via and reliable connection to the interface). Further, costs associated with materials, processes and additional tooling to generate the through vias can be high.

It is therefore desired to have a process for creation of through package vias by utilizing existing tools for manufacturing encapsulated packages. It is further desired that the mechanism for providing through vias allows for flexible configurations of vias and dies incorporated into a device package.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

A semiconductor device package having pre-formed and placed through vias and a process for making such a package is provided. One or more signal conduits (e.g., conductive pillars or optical waveguides) are placed in a holder that is subsequently embedded in an encapsulated semiconductor device package. The ends of the signal conduits are exposed and the signal conduits are then used as through vias, providing signal-bearing pathways between interconnects or contacts on the bottom and top of the package. Holders can be provided in a variety of geometries and materials, depending upon the nature of the application. Further, multiple holders with signal conduits can be provided in a single package to provide for more complex interconnect configuration demands in, for example, system-in-a-package (SiP) applications.

For convenience of explanation, and not intended to be limiting, the present invention is described for semiconductor devices, but persons of skill in the art will understand that the present invention applies to any type of electronic or opto-electronic device that is substantially planar. Accordingly, such other types of devices including the non-limiting examples given below, are intended to be included in the terms "device," "semiconductor device," and "integrated circuit" whether singular or plural, and the terms "device," "die," and "chip" are intended to be substantially equivalent. Non-limiting examples of suitable devices are semiconductor integrated circuits, individual semiconductor devices, piezoelectric devices, solid-state filters, magnetic tunneling structures, integrated passive devices such as capacitors, resistors and inductors, and combinations and a raise of any and all of these types of devices and elements. Further, embodiments of the present invention do not depend upon the types of die or chips being used nor the materials of which they are constructed provided that such materials withstand the encapsulation process.

The following detailed description is merely exemplary in nature and is not intended to limit the invention or the application and uses of the invention. Furthermore, there is no intention to be bound by any expressed or implied theory presented in the preceding technical field, background, brief summary or the following detailed description. In some examples, the signal conduit for passing a signal from one side of the device package to another is described as a conductive via. It should be recognized that such examples are not intended to limit embodiments of the present invention to electrically conductive materials, as the signal conduit can include additional materials such as waveguide for passing optical signals.

Figure 1:
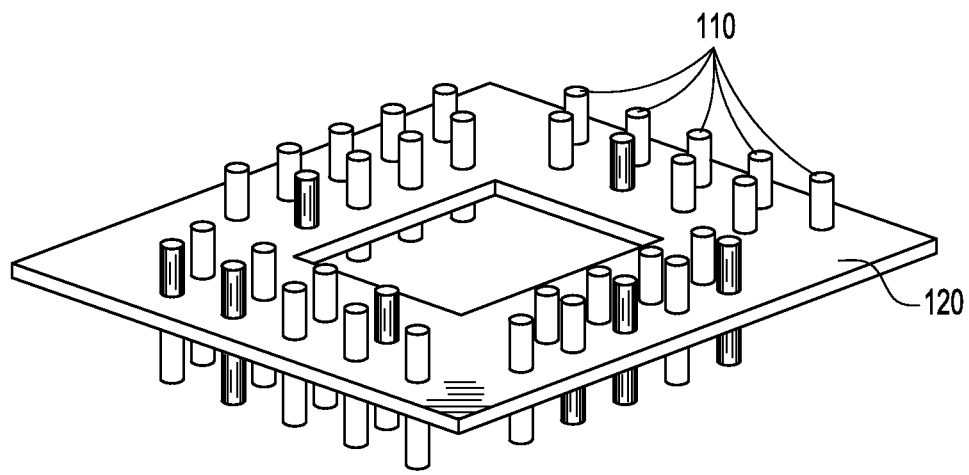
FIG. 1 is a simplified block diagram illustrating a holder and signal conduit assembly in accord with one embodiment of the present invention.

FIG. 1 is a simplified block diagram illustrating a holder and signal conduit assembly in accord with one embodiment of the present invention. Signal conduits 110 are arranged in a holder 120. Signal conduits 110 can be made from any material suitable to the application. For example, conductive signal conduits can be made from a variety of electrically conductive materials including, for example, copper, gold, aluminum, tungsten, and alloys thereof, doped materials (e.g., phosphorus, boron-doped polysilicon), super-conducting materials and ceramics (e.g., copper oxide materials (such as $HgBa_2Ca_2Cu_3O_x$, and $Bi_2Sr_2Ca_2Cu_3O_{10}$(BSCCO)), iron-based materials (such as SmFeAs(O,F)) and other metallic-based materials (such as $Nb_3Sn$)), the choice of which is dependent upon the nature of the application. The signal conduits 110 could also be made of more than one type of material depending on the process to create the conduits, assembly and particular package structures. As another example, optical waveguides can be planar or fiber and include materials such as glass, polymer, and semiconductor (polysilicon or crystalline silicon). In addition, the length of each signal conduit depends upon the nature of the application in the finished package product (e.g., the desired thickness of the encapsulated portion of the package product), and can typically be in a range of 100 μm to 2 mm.

Holder 120 can be provided in a variety of shapes, depending upon the nature of the application and the package layout. Holder 120 can be formed from a variety of materials including, for example, epoxy, ceramic, and metal. Signal conduits 110 can be attached to the holder through a molding process, pressing, or other methodologies appropriate to the nature of the materials of both the conduits and the holder. While FIG. 1 illustrates holder 120 as coming into contact with the middle of signal conduits 110, the holder can attach to the conduits at any location along their length, depending upon the nature of the application and post-encapsulation processing. For example, a holder attached to the ends of the conduits can be removed from an encapsulated product through a grinding process, while a holder attached to the middle of the conduits can remain embedded in the finished product.

Figure 2:
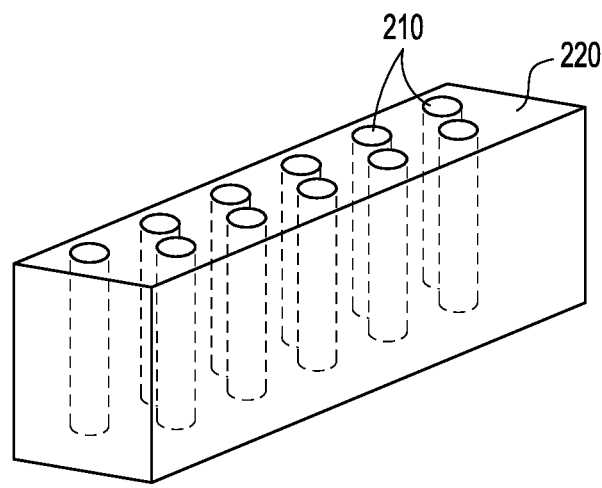
FIG. 2 is a simplified block diagram illustrating an alternative holder and signal conduit assembly in accord with another embodiment of the present invention.

FIG. 2 is a simplified block diagram illustrating an alternative holder and signal conduit assembly in accord with another embodiment of the present invention. Signal conduits 210 are embedded in a holder 220. Holder 220 can be made from a variety of moldable, non-conductive materials, such as substrate core or a ceramic, for example. In one embodiment, the signal conduits are built into the holder material. For example, a hole is drilled into the holder, followed by metallization process to form the conduit. A standard or a modified BGA or Flip Chip substrate process can be used to form such a conduit assembly. The ends of conduits 210 are exposed, while the sides of the conduits along their lengths are held by holder 220. In one application, strips of such holder/conduit assemblies can be manufactured and then cut to lengths (or number of signal conduits) desired for an application.

Signal conduits 210 can have a structure that includes more than more type of material. For instance, the end of conduits can be formed with a finish that has good adhesion with interconnection structures, or a type of material that is used by downstream process stages (e.g., exposure of conduits after encapsulation). Further, different materials can be applied between a center and edges of conduits.

Figure 3:
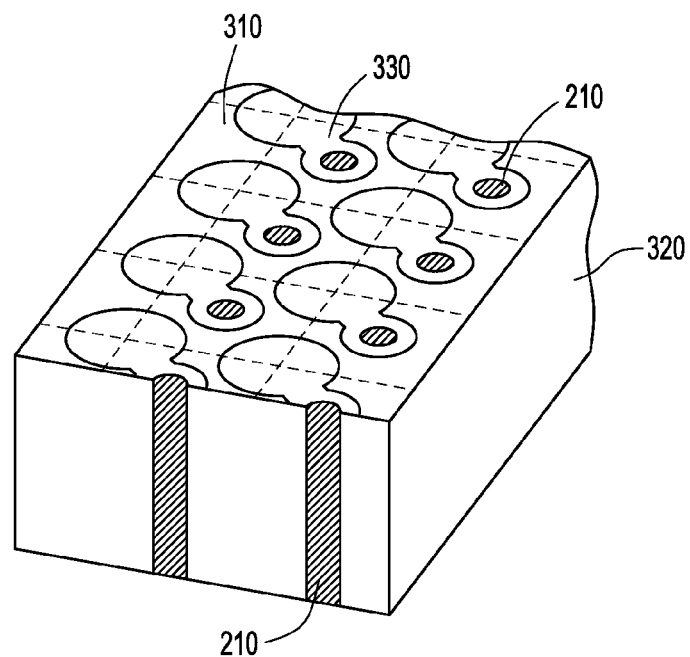
FIG. 3 is a simplified block diagram illustrating an alternative holder and signal conduit assembly having a routing layer on at least one side of the holder.

FIG. 3 is a simplified block diagram illustrating an alternative holder and signal conduit assembly having a routing layer on at least one side of the holder. As in FIG. 2, signal conduits 210 are embedded in a holder 310. Holder 310 can be made from a similar variety of materials as that discussed for holder 220, and the signal conduits can be built into the holder in a similar fashion. Contacts 320 are coupled to corresponding signal conduits 210 through a routing layer 330. The routing layer provides an advantage of flexibility in an interconnection arrangement, as well as avoiding possible process issues that may arise from interconnection layers directly built on top of conduits. Routing layer 330 can be built on holder 310 using an etching or plating technique. One or both sides of holder 310 can be provided with a routing layer and contacts. Contact pads can be defined using masking techniques.

Figure 4:
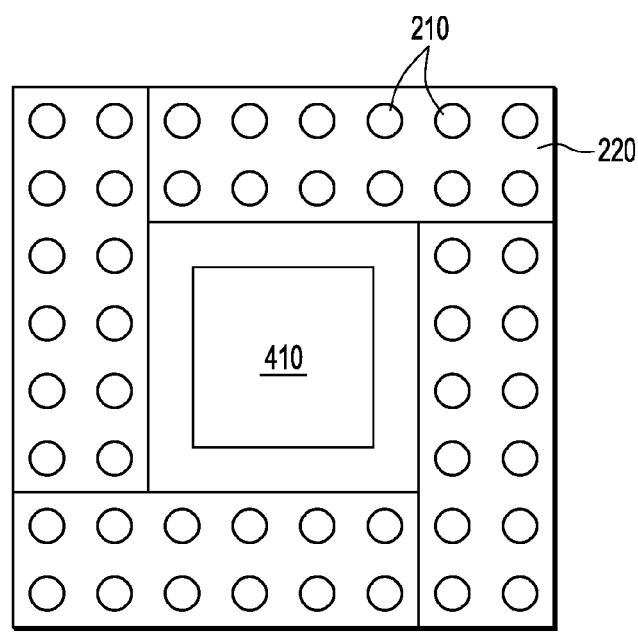
FIG. 4 is a simplified block diagram illustrating one example of a geometry possible using the modular holders of embodiments of the present invention.

FIG. 4 is a simplified block diagram illustrating one example of a geometry possible using the modular holders of FIG. 2. A top view is provided showing signal conduits 210 in holders. In the example, four holders are arranged in a square configuration. Placed in the space interior to the square is a die 410. Placement of holders and die for an application can be provided by, for example, a pick and place procedure used in semiconductor package assembly.

Figure 5:
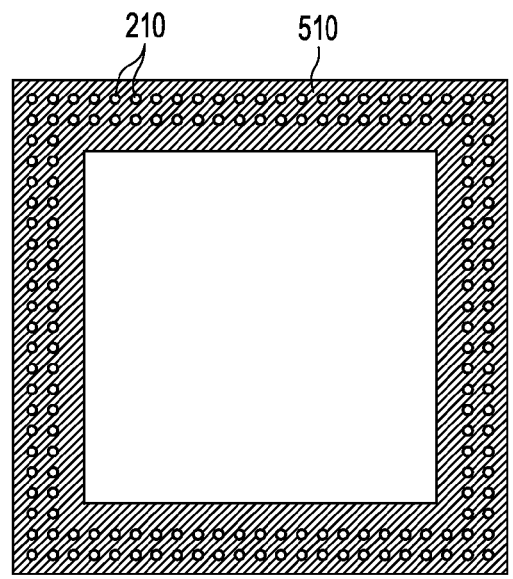
FIG. 5 is a simplified block diagram illustrating another example of a possible geometry, using a frame shaped holder of one embodiment of the present invention.

FIG. 5 is a simplified block diagram illustrating another example of a possible geometry, using a frame-shaped holder 510. Holder 510 can be constructed as described above for holders 220 and 310.

Figure 6:
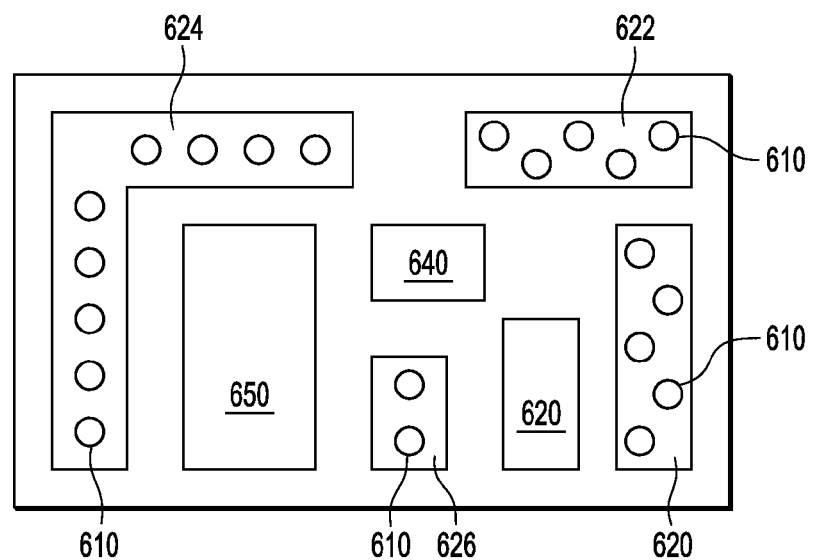
FIG. 6 is a simplified block diagram illustrating another example of a geometry possible using the signal conduits and holders of the present invention.

FIG. 6 is a simplified block diagram illustrating another example of a geometry possible using the signal conduits and holders of the present invention. A top view is provided showing, for example, signal conduits 610 in a variety of holders 620, 622, 624 and 626. In addition, components 630, 640 and 650 are placed in a configuration appropriate to the application. FIG. 6 illustrates device configuration flexibility made possible by differing shapes and arrangements of holders. A single package providing components and vias of FIG. 6 can be found in, for example, system-in-a-package applications. It should be understood that the geometries and configurations provided herein are made by way of example and are not intended to limit the nature or applications of embodiments of the present invention.

It should further be noted that embodiments of the present invention do not depend on the exact nature of the component (e.g., 410, 630, 640, and 650). The component can be, for example, integrated circuits, individual devices, filters, magnetostrictive devices, electro-optical devices, electro-acoustic devices, integrated passive devices such as resistors, capacitors and inductors, or other types of elements and combinations thereof, and can be formed of any materials able to withstand the encapsulation process. Non-limiting examples of materials are various organic and inorganic semiconductors, type IV, III-V and II-VI materials, glasses, ceramics, metals, semi-metals, inter-metallics and so forth.

Figure 7:
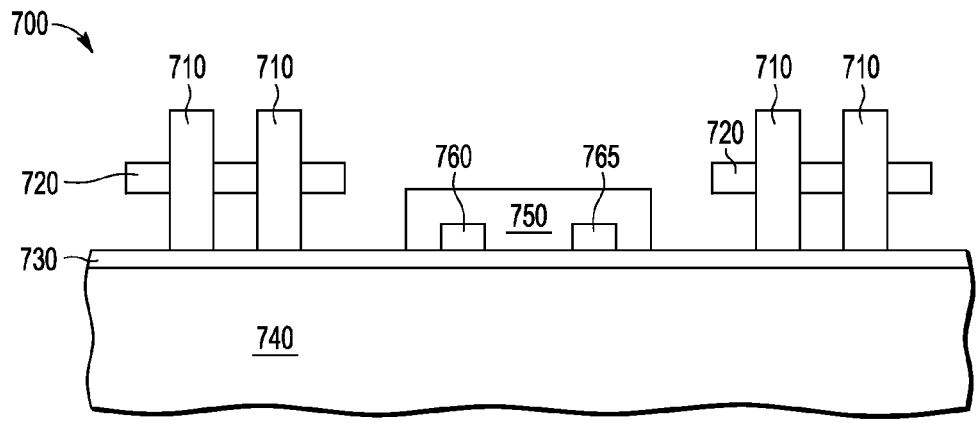
FIG. 7 is a simplified block diagram illustrating cross sectional view of a device structure at a stage of processing, according to an embodiment of the present invention.

FIG. 7 is a simplified block diagram illustrating a cross-sectional view of a device structure 700 at a stage in one example of processing, according to an embodiment of the present invention. Signal conduits 710 are attached to a holder 720 and are placed on an adhesive tape 730 on a carrier 740. Tape 730 can be of a standard type used in semiconductor packaging processing including, for example, a double-sided polyimide sticky tape having a silicone adhesive on both sides. The adhesive layer should be of the type that can withstand the packaging processing without becoming brittle or permanently fixed in place, since at a later point in processing the tape will be separated from the package. In addition to the signal conduit/holder assemblies ("conduit assemblies"), at least a die 750 is placed active surface face down on tape 730. The "active surface" of die 750 is a surface of the die having bond pads 760 and 765.

Figure 8:
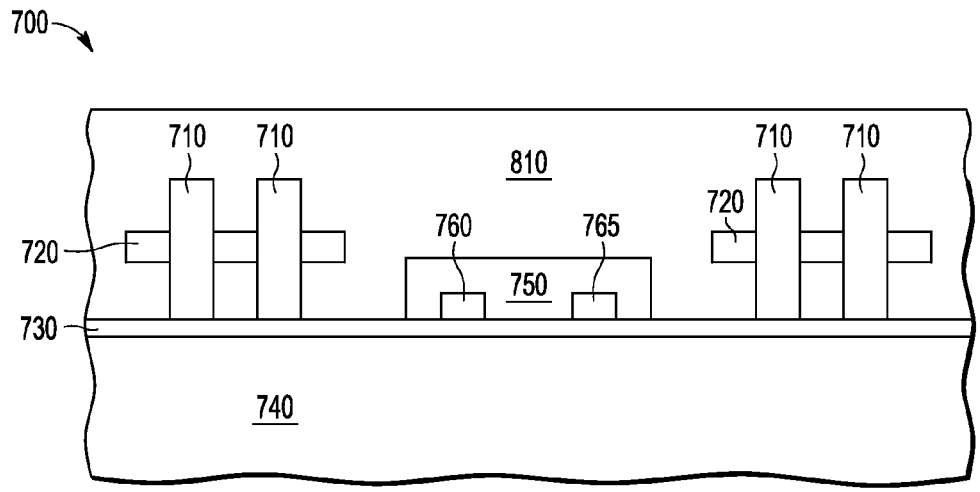
FIG. 8 is a simplified block diagram illustrating the cross sectional view of the device structure at a later stage of processing, according to an embodiment of the present invention.

FIG. 8 is a simplified block diagram illustrating the cross sectional view of device structure 700 at a later stage in the processing example. A molding material is applied to the structures affixed to tape 730 (e.g., signal conduits 710, holder 720, and die 750), forming an encapsulant 810 that encapsulates the structures within the molding material and forms a panel. The molding material can be any appropriate encapsulant including, for example, silica-filled epoxy molding compounds, plastic encapsulation resins, and other polymeric materials such as silicones, polyimides, phenolics, and polyurethanes. The molding material can be applied by a variety of standard processing techniques used in encapsulation including, for example, printing, pressure molding and spin application. Once the molding material is applied, the panel can be cured by exposing the materials to certain temperatures for a period of time, or by applying curing agents, or both. In a typical encapsulation process, a depth of encapsulant 810 can exceed a maximum height of structures embedded in the molding material (e.g., the height of pillars 710 as illustrated in FIG. 8).

Figure 9:
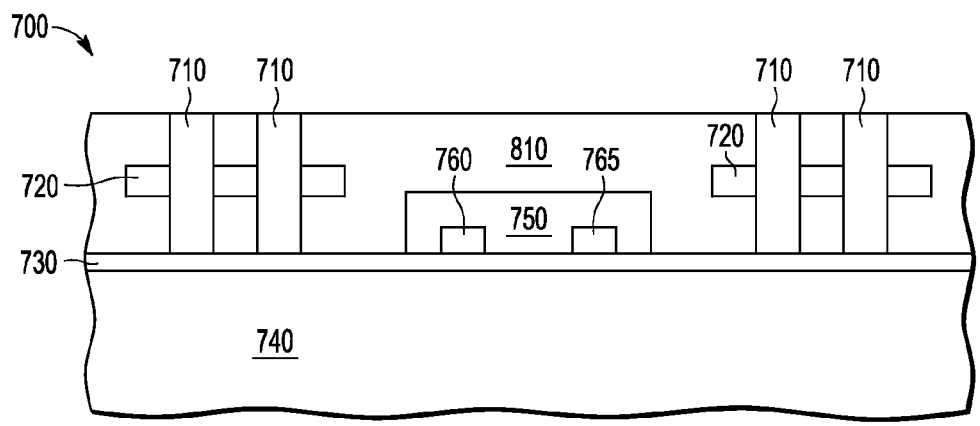
FIG. 9 is a simplified block diagram illustrating the cross sectional view of the device structure at a later stage of processing, according to an embodiment of the present invention.

FIG. 9 is a simplified block diagram illustrating the cross sectional view of device structure 700 at a later stage in the processing example. Encapsulant 810 is reduced in thickness to expose the ends of signal conduits 710. This reduction in thickness of the encapsulant and exposing of the ends of the signal conduits can be performed by a grinding process, chemical etching, laser ablation, or other conventional techniques (e.g., back grinding), or alternatively by forming the encapsulant to the appropriate thickness during the encapsulation process.

Figure 10:
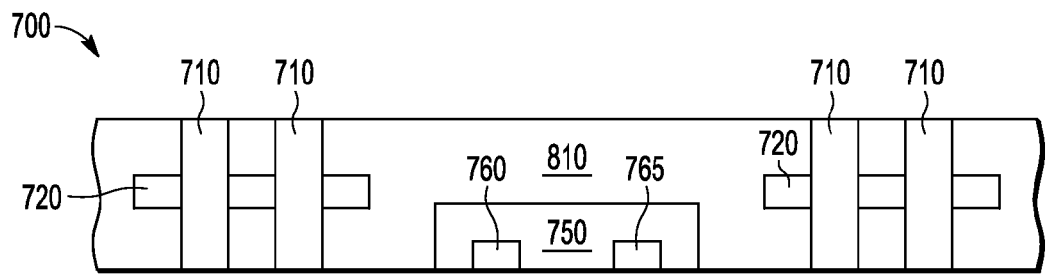
FIG. 10 is a simplified block diagram illustrating the cross sectional view of the device structure at a later stage of processing, according to an embodiment of the present invention.

FIG. 10 is a simplified block diagram illustrating the cross sectional view of device structure 700 at a later stage in the processing example. The encapsulated panel is removed from tape 730 (and carrier 740). Once released from the tape, the side of the panel previously attached to the tape can be cleaned to remove any excess adhesive remaining attached to the encapsulated panel. This process of tape release and clean exposes all of the contacts on the bottom side of the panel, including the bottom ends of signal conduits 710 and bond pads 760 and 765. At this point, it can be seen that signal conduits 710 form conductive or optical through vias between the top and bottom of the encapsulated panel. These through vias can be used, for example, to enable electrical connection between interconnect structures or pads formed on the bottom and top of packages formed from the panel.

Figure 11:
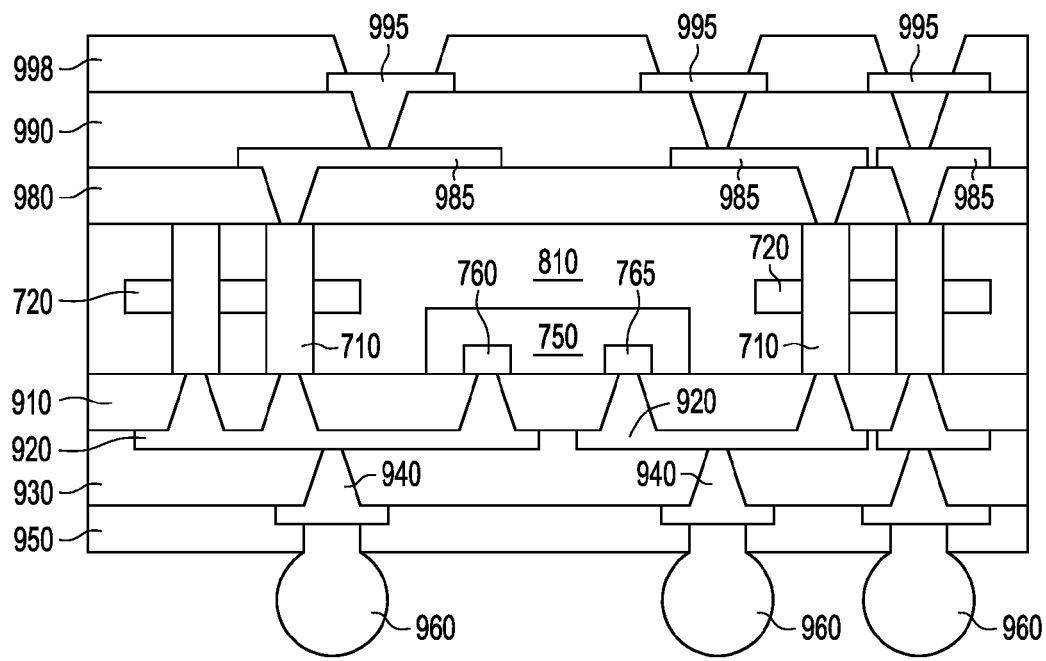
FIG. 11 is a simplified block diagram illustrating the cross sectional view of the device structure after buildup, ball placement and singulation processing.

FIG. 11 is a simplified block diagram illustrating the cross sectional view of device structure 700 after buildup, ball placement and singulation. Processing providing the various layers illustrated in FIG. 11 can be provided by standard techniques used in semiconductor packaging.

An insulating layer 910 can be deposited over the bottom surface of the encapsulated die, signal conduits and encapsulation molding material. Insulating layer 910 can be made from organic polymers, for example, in liquid or dry film and can include a wide range of other materials used for interlayer dielectrics as known in the art (e.g., silicon dioxide, silicon nitride, silicon oxynitride, or any combination of such layers providing electrical isolation). Insulating layer 910 can be patterned to expose bonding pads 760 and 765, as well as the ends of through vias 710 (from electrically-conductive signal conduits).

A conductive layer 920 can then be deposited to provide an interconnect between the bonding pads and signal conduits. Conductive layer 920 can include materials such as metal, metal alloy, doped semiconductor, semi-metals, or combinations thereof as known in the art (e.g., amorphous silicon, doped polysilicon, aluminum, copper, tantalum, titanium, tungsten, or any metal alloy, nitride or silicide). Through the use of a conductive layer, any number of bonding pads can be interconnected in any combination to the same or other die and to the vias formed by electrically conductive signal conduits 710. The interconnect illustrated in FIG. 11 is provided only by way of example, and it should be realized that the interconnects formed by conductive layer 920 and other conductive layers discussed below can extend not only across the page as illustrated but also into and above the page.

An additional interconnect layer can be provided by forming additional insulating layers (e.g. insulating layer 930) and patterning those insulating layers to receive additional conductive layers (e.g., conductive layer 940). The range of materials that can be used for subsequent insulating layers and conductive layers can include those listed for insulating layer 910 and conductive layer 920, and each type of layer can be the same or different materials as required by the nature of the application. Further, as illustrated, a set of conductive ball connectors can be provided by forming insulating layer 950, patterning that layer to expose pads formed in conductive layer 940, and forming and placing conductive balls 960 using standard techniques and materials.

FIG. 11 illustrates a double-sided semiconductor package, in which an interconnect is provided on the top side of the package. Vias formed by electrically conductive signal conduits 710 allow for connections to be made between the bottom side interconnect and the top side interconnect. Again, the top side interconnect can be formed by standard techniques. For example, an insulating layer 980 can be formed over the top side surface of the pillars and encapsulation molding material. The insulating layer can be patterned to expose the top end of the vias formed by pillars 710. A conductive layer 985 can then be used to form an interconnect, which can be patterned and etched as required by the application. Subsequent insulating layers (e.g. insulating layer 990) and conductive layers (e.g. conductive layer 995) can be formed as required by the application. An additional insulation layer 998 can be formed to define a pattern to receive components on the top side of the package. After buildup of top and bottom side interconnects has been performed, individual semiconductor packages can be separated from the panel using a singulation process.

Figure 12:
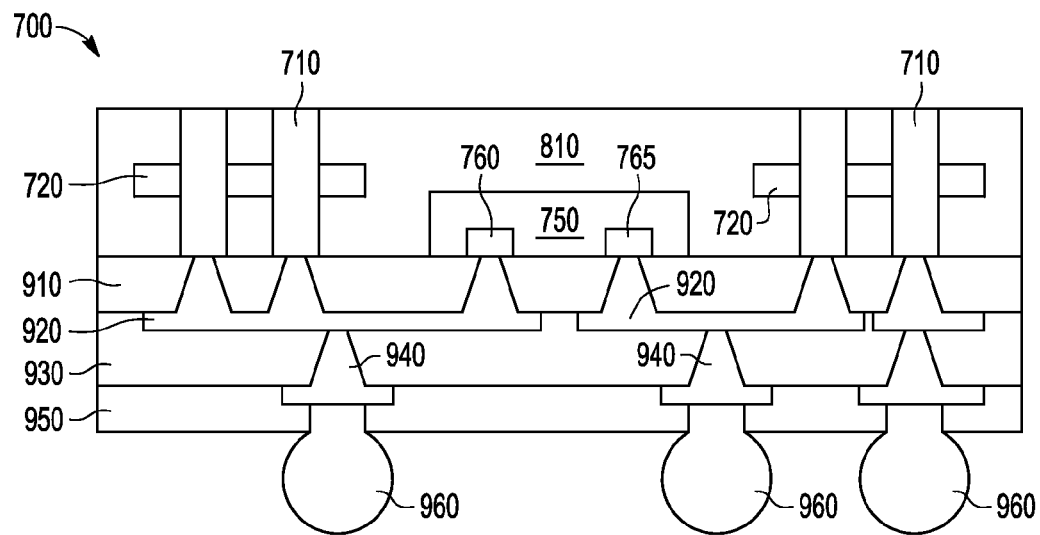
FIG. 12 is a simplified block diagram illustrating a cross sectional view of the device structure after buildup, ball placement and singulation according to an alternative embodiment having a single sided interconnection.

FIG. 12 is a simplified block diagram illustrating a cross sectional view of device structure 700 after buildup, ball placement and singulation according to an alternative embodiment having a single sided interconnection (e.g., a fan-out wafer level packaging structure). In this embodiment, an interconnect structure similar to that of FIG. 11 is built up over the bottom surface of the encapsulated die, signal conduits and encapsulation molding material. But no interconnect structure is built on the top surface. In such an embodiment, components can be directly attached to the top end of vias.

Figure 13:
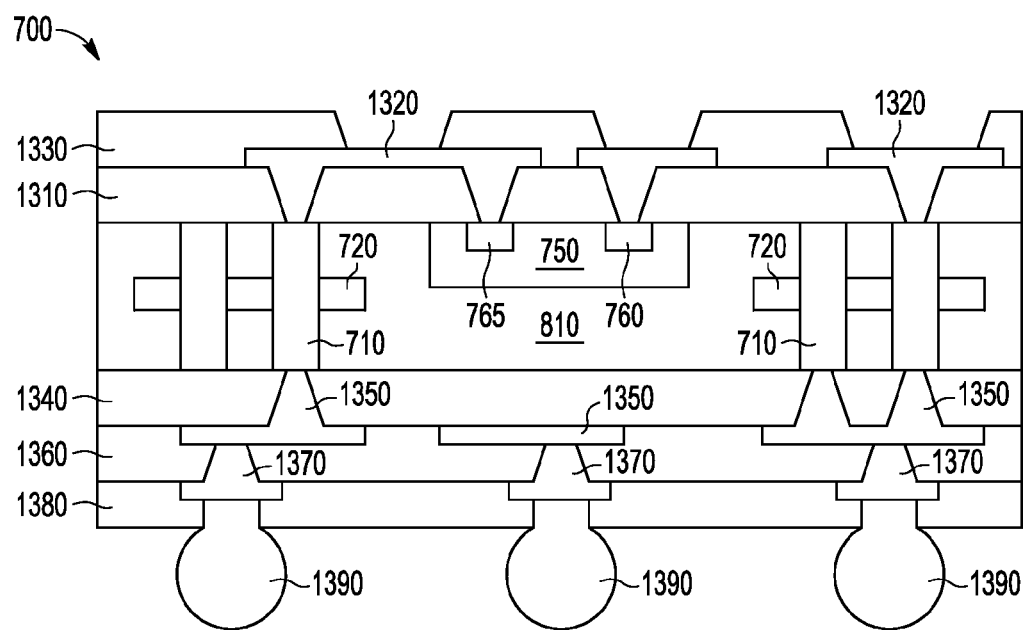
FIG. 13 is a simplified block diagram illustrating a cross sectional view of the device structure after buildup, ball placement and singulation according to an alternative embodiment in which the conductive balls are attached to the interconnection structures at one side of the encapsulant and another side of package is used to receive the components.

FIG. 13 is a simplified block diagram illustrating a cross sectional view of device structure 700 after buildup, ball placement and singulation according to an alternative embodiment in which the conductive balls are attached to the interconnection structures at one side of the encapsulant and another side of package is used to receive the components. Processing providing the various layers in FIG. 13 can be provided by standard techniques used in semiconductor packaging.

An insulating layer 1310 can be deposited over the surface of the encapsulated die, signal conduits and encapsulation molding material. This surface is illustrated as the same surface as that corresponding to the bonding pads for the encapsulated die. Insulating layer 1310 can be formed from the same materials as described for insulating layer 910 above. Insulating layer 1310 can be patterned to expose bonding pads 760 and 765, as well as the ends of through package vias 710.

A conductive layer 1320 can be deposited over insulating layer 1310 to provide an interconnect between bonding pads and signal conduits. Conductive layer 1320 can be formed from the same materials used in conductive layer 920 above. An insulating layer 1330 can be formed and patterned over layer 1320 to define contacts for other components to be attached to device structure 700.

Another interconnect structure can be built on the other side of device structure 700. As illustrated, an insulating layer 1340 is formed and patterned so that a conductive layer 1350 can be formed to provide an interconnect between signal conduits and other contacts. A subsequent insulating layer 1360 can be formed and patterned to receive another conductive layer 1370. A set of conductive ball connectors can be provided by forming an insulating layer 1380 and forming and placing conductive balls 1390 using standard techniques and materials.

As illustrated in the above figures, holder 720 remains incorporated in the encapsulated device structure. In some applications it may be desirable to remove the holder from the encapsulated device. For example, if a metal holder is used to hold electrically-conductive signal conduits 710, then it may be desirable to remove the holder to electrically isolate the various pillars. In such a case, the metal holder may be affixed to the pillars at the end of the pillars. The metal holder can then be removed from the encapsulated package during the back grinding process, either through a physical grinding process or by etching, for example.

Embodiments of the present invention are not limited to the particular type of process illustrated in the figures. As shown, embodiments of the present invention are used in a fan-out wafer level package, (e.g. redistributed chip packaging process (RCP)), but embodiments of the present invention are not limited to fan-out wafer level package. For example, through vias formed by the drop-in signal conduits of the present invention can be incorporated in wire bonded processes such as QFN, leaded packages, and BGA, as well as flip chip processes. It should be realized, however, that steps discussed above may require modification for different types of processes. For example, leaded packages may not structurally permit a backside grind to expose the pillars, and therefore alternative processes will be used (e.g., laser ablation). In addition, the drop-in signal conduits may need to be attached to lead frames using techniques such as solder reflow and the like.

The signal conduits and holders of the present invention allow for pre-placement of through vias prior to encapsulation. Conduits and holders can be formed in a manner that allows for them to be dropped into place during a pick and place process, at the same time as other components such as the die. This allows for great flexibility in through via placement. The conduit assembly could be also pre-arranged in a group form (e.g., a repeating sequence of conduits in holders). The group form can be attached onto the tape at same time before the pick and place process. The signal conduits are embedded in the package during the encapsulation process. The signal conduits are then exposed during standard back grinding of the encapsulant or can be exposed using alternate methods such as laser ablation. Subsequent buildup of the encapsulated device can use the signal conduits as through package connections (e.g. through vias).

The processes of the present invention save the need for post-encapsulation via drilling and filling steps. Incorporation of the through vias occurs at the same stage in processing as other pick and place operations, or before pick and place. Further, the process provides consistent quality signal paths through the depth of the package that do not depend upon a quality of a fill operation.

By now it should be appreciated that a method for packaging an electronic device assembly has been provided in which a conduit assembly comprising a holder and one or more signal conduits attached to the holder is provided and placed in a first area for the electronic device assembly, a first electronic device is placed in a second area for the electronic device assembly, and encapsulant is formed over and around sides of the first electronic device and over and around sides of the conduit assembly, and a first end of a signal conduit of the one or more signal conduits and a second end of the signal conduits is exposed forming a via through the encapsulated electronic device assembly.

In one aspect of the above embodiment, exposing one or more of the ends of the signal conduit includes removing a portion of the encapsulant from the electronic device assembly. In a further aspect, removing the encapsulant includes grinding the encapsulant from the electronic device assembly to a depth matching the end of the signal conduit. In another aspect, removing the encapsulant includes laser ablating the encapsulant from the electronic device assembly to a depth matching the end of the signal conduit. In an another aspect, an alternative encapsulation technique can be applied to expose the ends of signal conduit without removing a portion of the encapsulant (e.g. molding with film).

In another aspect of the above embodiment a double-sided adhesive tape is disposed on a carrier. The pillar assembly is placed on the tape with an end of each signal conduit in contact with the tape, and the exposing includes removing the tape from the encapsulated electronic device assembly.

In another aspect of the above embodiment, the holder is a metal holder and the one or more signal conduits are attached at an end of each signal conduit to the metal holder. In a further aspect, exposing the signal conduit includes grinding the encapsulant from the electronic device assembly to a depth matching the metal holder, and removing the metal holder from the electronic device assembly. In still a further aspect, removing the metal holder includes one of grinding or etching the metal holder from the electronic device assembly.

In another aspect of the above embodiment, the holder is made of a non-conductive material. In a further aspect, the holder is made of a substrate core or a ceramic material and the one or more signal conduits are embedded in the holder, with the ends of the signal conduit being exposed.

In another aspect of the above embodiment, a second conduit assembly that includes a second holder and a set of second signal conduits is provided and placed in a third area for the electronic device assembly, the encapsulant is formed over and around sides of the second conduit assembly, and first and second ends of a second signal conduit in the set of second signal conduits is exposed to form a second via through the encapsulated device assembly. In a further aspect, a second electronic devices placed in a fourth area for the electronic device assembly and the encapsulant is formed over and around sides of the second electronic device.

In another aspect of the above embodiment, a frame or substrate is provided in the first area for the electronic device assembly, wherein placing the conduit assembly includes placing the first end of the signal conduit on the frame or substrate, and the first end of the signal conduit is attached to the frame or substrate using a conductive bond. In still another aspect of the above embodiment, exposing one or more the ends of the signal conduit further includes forming the encapsulant so that the encapsulant is of a thickness matching the ends of the signal conduits. In yet another aspect of the above embodiment, an end of the signal conduit is coupled to an electrical contact of the first electronic device using one of wire bonded, flip chip bumping or other techniques.

A package device assembly has also been provided that includes an electronic device, one or more through vias extending from a top surface of the package device assembly to a bottom surface of the package device assembly, and encapsulant over and around the electronic device and around the through vias and forming an encapsulated region of the package device assembly, wherein the one or more through vias are formed using corresponding signal conduits and each signal conduit is formed before encapsulating the electronic device and signal conduits. In one aspect of the above embodiment, a conduit assembly that includes a holder and the one or more signal conduits attached to the holder is included, and each signal conduit has a length equal to a thickness of the encapsulated region. In a further aspect, the holder is made of one of a substrate core or a ceramic material and the one or more signal conduits are embedded in the holder. In another further aspect, the routing could be made on one side or both side or inside of the holder.

A method for packaging an electronic device has also been provided that includes providing one or more signal conduits each having a length equal to a thickness of an encapsulated region of the package, attaching the one or more signal conduits to holder to form a conduit assembly, placing the conduit assembly in a first area for the electronic device package, placing a first electronic device in a second area for the electronic device package, forming an encapsulant over and around sides of the first electronic device and over and around sides of the conduit assembly, and exposing the ends of a signal conduit of the one or more signal conduits, thereby forming a via through the encapsulated electronic device assembly. In one aspect of the above embodiment, the signal conduits are attached to the holder by one of molding the holder material around the signal conduits or pressing the signal conduits into the holder material Because the apparatus implementing the present invention is, for the most part, composed of electronic components and circuits known to those skilled in the art, circuit details are not explained in any greater extent than that considered necessary as illustrated above, for the understanding and appreciation of the underlying concepts of the present invention and in order not to obfuscate or distract from the teachings of the present invention.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for packaging an electronic device assembly, the method comprising:
    providing a conduit assembly comprising a holder and one or more signal conduits attached to the holder, wherein
        the holder comprises a moldable, non-conductive material, and
        the moldable, non-conductive material is one of a substrate core or a ceramic;
    placing the conduit assembly in a first area of a carrier for the electronic device assembly, wherein the carrier is distinct from the holder;
    placing a first electronic device in a second area of the carrier for the electronic device assembly;
    forming an encapsulant over and around sides of the first electronic device and over and around sides of the conduit assembly; and
    exposing a first end of a signal conduit of the one or more signal conduits and a second end of the signal conduit, wherein
        the signal conduit forms a via through the encapsulated electronic device assembly, and
        the signal conduit couples an interconnect formed on a first major surface of the encapsulated electronic device assembly with an interconnect formed on a second major surface of the encapsulated electronic device assembly.

2. The method of claim 1 wherein said exposing further comprises removing a portion of the encapsulant from the electronic device assembly.

3. The method of claim 2 wherein said removing further comprises one of:
grinding the encapsulant from the electronic device assembly to a depth matching the end of the signal conduit; and
laser ablating the encapsulant from the electronic device assembly to a depth matching the end of the signal conduit.

4. The method of claim 1 wherein said exposing further comprises performing said forming the encapsulant exposes the ends of conduit without removing a portion of the encapsulant.

5. The method of claim 1 further comprising:
providing a double-sided adhesive tape disposed on the carrier, wherein
said placing the conduit assembly comprises placing the conduit assembly on the tape with an end of each signal conduit in contact with the tape, and
said exposing comprises removing the tape from the encapsulated electronic device assembly.

6. The method of claim 1, wherein
the one or more signal conduits are embedded in the holder; and
the first and second ends of the signal conduit are exposed.

7. The method of claim 1 wherein the conduit assembly comprises a conductive routing on one or both sides of the holder or inside the holder, wherein the conductive routing is coupled to one or more of the signal conduits.

8. The method of claim 1 further comprising:
providing a second conduit assembly comprising a second holder and second signal conduits attached to the second holder;
placing the second conduit assembly in a third area for the electronic device assembly;
forming the encapsulant over and around sides of the second conduit assembly; and
exposing first end of a second signal conduit of the second signal conduits and a second end of the second signal conduit, wherein
the second signal conduit forms a second via through the encapsulated electronic device assembly.

9. The method of claim 8 further comprising:
placing a second electronic device in a fourth area for the electronic device assembly; and
forming the encapsulant over and around sides of the second electronic device.

10. The method of claim 1 further comprising:
providing a frame or substrate in the first area for the electronic device assembly, wherein
said placing the conduit assembly comprises placing the first end of the signal conduit on the frame or substrate; and
attaching the first end of the signal conduit to the frame or substrate using a conductive bond.

11. The method of claim 1 further comprising:
coupling one of the first and second end of the signal conduit to an electrical contact of the first electronic device, wherein said coupling is performed using one of wire bond, flip chip bumping or other techniques.

12. A method for packaging an electronic device, the method comprising:
providing one or more signal conduits, wherein each signal conduit has a length equal to a thickness of an encapsulated region of the package;
attaching the one or more signal conduits to a holder to form a conduit assembly, wherein
the holder comprises a moldable, non-conductive material, and
the moldable, non-conductive material is one of a substrate core or a ceramic;
placing the conduit assembly in a first area of a carrier for the electronic device package, wherein the carrier is distinct from the holder;
placing a first electronic device in a second area of the carrier for the electronic device package;
forming an encapsulant over and around sides of the first electronic device and over and around sides of the conduit assembly;
exposing a first end of a signal conduit of the one or more signal conduits and a second end of the signal conduit, wherein
the signal conduit forms a via through the encapsulated electronic device assembly;
forming a first interconnect structure on a first major surface of the electronic device package, wherein the first interconnect structure is coupled to the first end of the signal conduit; and
forming a second interconnect structure on a second major surface of the electronic device package, wherein the second interconnect structure is coupled to the second end of the signal conduit.

13. The method of claim 12 wherein said attaching the one or more signal conduits to the holder comprises one of
molding the holder material around the one or more signal conduits, and
pressing the one or more signal conduits into the holder material.

* * * * *